(12) United States Patent
Chang et al.

(10) Patent No.: US 9,515,007 B2
(45) Date of Patent: Dec. 6, 2016

(54) SUBSTRATE STRUCTURE

(71) Applicant: Siliconware Precision Industries Co., Ltd., Taichung (TW)

(72) Inventors: Cheng-An Chang, Taichung (TW); Sung-Huan Sun, Taichung (TW); Chien-Hung Wu, Taichung (TW); Yi-Cheih Chen, Taichung (TW); Wen-Kai Liao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/879,254

(22) Filed: Oct. 9, 2015

(65) Prior Publication Data

US 2016/0190039 A1    Jun. 30, 2016

(30) Foreign Application Priority Data

Dec. 31, 2014 (TW) .............................. 103146515 A

(51) Int. Cl.
*H01L 23/48* (2006.01)
*H01L 23/498* (2006.01)
*H01L 23/00* (2006.01)
*H01L 23/31* (2006.01)
*H01L 23/528* (2006.01)

(52) U.S. Cl.
CPC ......... *H01L 23/481* (2013.01); *H01L 23/3157* (2013.01); *H01L 23/49822* (2013.01); *H01L 23/49827* (2013.01); *H01L 23/49838* (2013.01); *H01L 23/528* (2013.01); *H01L 24/06* (2013.01); *H01L 2224/0401* (2013.01)

(58) Field of Classification Search
CPC .. H01L 23/481; H01L 23/528; H01L 23/3157; H01L 23/49822; H01L 23/49838; H01L 24/06
USPC .......................... 257/774, 758; 438/113, 114
See application file for complete search history.

(56) References Cited

U.S. PATENT DOCUMENTS

| | | | | |
|---|---|---|---|---|
| 6,943,056 B2* | 9/2005 | Nemoto | ................ | H01L 21/568 257/E21.508 |
| 7,217,992 B2* | 5/2007 | Ogino | ................ | H01L 23/3114 257/669 |
| 8,299,581 B2* | 10/2012 | Daubenspeck | ......... | H01L 21/78 257/620 |
| 2006/0046350 A1* | 3/2006 | Jiang | ................ | H01L 23/49816 438/114 |
| 2009/0091001 A1* | 4/2009 | Park | ..................... | H01L 23/3185 257/620 |
| 2009/0321915 A1* | 12/2009 | Hu | ...................... | H01L 23/5389 257/690 |
| 2010/0019371 A1* | 1/2010 | Shiota | ................... | H01L 21/561 257/690 |

(Continued)

*Primary Examiner* — Nitin Parekh
(74) *Attorney, Agent, or Firm* — Mintz Levin Cohn Ferris Glovsky and Popeo, P.C.; Peter F. Corless; Steven M. Jensen

(57) ABSTRACT

A substrate structure includes: a substrate body defined with a layout area, a sealing member and a cutting area, the sealing member being adjacent to the layout area, and the cutting area being adjacent to the sealing member; a wiring layer formed on the layout area; an insulating layer formed on the layout area and the wiring layer; and a metal layer formed on the insulating layer and the layout area. The insulating layer is prevented from being delaminated due to the formation of the metal layer.

16 Claims, 3 Drawing Sheets

(56) References Cited

U.S. PATENT DOCUMENTS

| | | | | |
|---|---|---|---|---|
| 2011/0183470 A1* | 7/2011 | Watanabe | ........... | H01L 27/1266 438/114 |
| 2013/0316499 A1* | 11/2013 | Ni | ........... | H01L 23/3114 438/114 |
| 2016/0035639 A1* | 2/2016 | Wu | ........... | H01L 23/3114 257/690 |

* cited by examiner

SUBSTRATE STRUCTURE

CROSS-REFERENCES TO RELATED APPLICATIONS

This application claims under 35 U.S.C. §119(a) the benefit of Taiwanese Application No. 103146515, filed Dec. 31, 2014 the entire contents of which are incorporated herein by reference.

BACKGROUND OF THE INVENTION

1. Field of the Invention

This invention relates to substrate structures, and, more particularly, to a substrate structure for carrying semiconductor components.

2. Description of Related Art

With the rapid development of the electronic industry, electronic products have gradually moved towards a multi-functional and high-performance trend. Such the technology currently used in the field of the chip package includes the flip chip package module (e.g., the chip scale package, referred to as CSP; the direct chip attached package, referred to as DCA, or the multi-chip module package, referred to as MCM) or the technology to stack the chips three-dimensionally to integrate into a three-dimensional integrated circuit (3D IC) chip by stacking.

FIG. 1 is a schematic cross-sectional view of a conventional semiconductor substrate 1. FIG. 1' is a top schematic view of the semiconductor substrate 1.

As shown in FIGS. 1 and 1', the conventional semiconductor substrate 1 is a wafer that comprises a substrate body 10, a wiring layer 11, and an insulating layer 12.

The substrate body 10 is defined with a plurality of layout areas 100, a sealing member 101 adjacent to the layout area 100, and a cutting area 102 adjacent to the sealing member 101. When a singulation process is carried out along the cutting area 102, the surface of substrate body 10 sometimes cracks. The cracks split along the surface of the substrate body 10 in the direction of the wiring area 100. The sealing member 101 prevents the crack from extending to the layout area 100.

The wiring layer 11 is formed on a portion of the layout area 100, and has a plurality of conductive pads 110.

The insulating layer 12 is formed on a portion of the layout area 100 and the wring layer 11, and the conductive pads 110 are exposed from the insulating layer 12. An under bump metallurgy (UBM) 14 may be formed on the conductive pads 110, and a conductive member (not shown), such as a soldering material or metal bumps, may be formed on the under bump metallurgy 14 in subsequent processes.

However, since the contact area of the substrate body 10 with the insulating layer 12 is large, and the substrate body 10 and the insulating layer 12 have different coefficients of thermal expansion (CTE). It is difficult for the semiconductor substrate 1 to uniformly release the thermal stress during the thermal cycle. Thus, the insulating layer 12 is easily delaminated from the substrate body 10 when the insulating layer 12 is stressed. As a result, the semiconductor substrate 1 is easily subject to warpage.

Although the sealing member 101 can provide a blocking effect during the singulation process, the cracks still make damages on the sealing member 101 and thus extend to the layout area 100, which leads to damage of the wiring layer 11.

Therefore, it is indeed an important issue as to how to override various deficiencies of related traditional technologies.

SUMMARY OF THE INVENTION

To override various deficiencies of related traditional technologies, the present invention provides a substrate structure that includes: a substrate body having a sealing member and being defined with at least one layout area and a cutting area, wherein the sealing member is adjacent to the layout area and the cutting area is adjacent to the sealing member such that the sealing member is positioned between the layout area and the cutting area; a wiring layer formed on a first portion of a surface of the layout area; an insulating layer formed on the wiring layer and on a second portion of the surface of the layout area; and a metal layer formed on the insulating layer and on a third portion of the surface of the layout area.

In an embodiment, the sealing member surrounds the layout area.

In an embodiment, the sealing member is in the shape of a grating or a ring.

In an embodiment, the wiring layer has a plurality of conductive pads that are exposed from the insulating layer. The substrate structure further comprises an under bump metallurgy formed on each of the conductive pads. In an embodiment, the under bump metallurgy and the metal layer are made of the same or different materials, and have the same or different thicknesses.

In an embodiment, the metal layer is not in contact with the wiring layer.

In an embodiment, the metal layer is in contact with the sealing member. In another embodiment, the metal layer is not in contact with the sealing member.

In an embodiment, the substrate structure further comprises a dielectric layer formed between the insulating layer and the substrate body. In an embodiment, the insulating layer and the dielectric layer are made of the same or different materials.

From the above, the substrate structure according to the present invention has a metal layer formed on the surface of the substrate body and on the insulating layer, such that the bonding force between the substrate body and the insulating layer is increased, and the insulating layer can be prevented from being delaminated.

During a singulation process, the metal layer prevents the cracks of the cutting area of the substrate body from extending to the layout area. Therefore, the metal layer can prevent the wiring layer from being damaged, and the yield rate of the product is increased.

BRIEF DESCRIPTION OF DRAWINGS

The invention can be more fully understood by reading the following detailed descriptions of the preferred embodiments, with reference made to the accompanying drawings, wherein:

FIG. 1' illustrates a top-view schematic diagram of the semiconductor substrate shown in FIG. 1;

FIG. 2' illustrates a top-view schematic diagram of the substrate structure shown in FIG. 2.

DETAILED DESCRIPTION OF THE INVENTION

The following illustrative embodiments are provided to illustrate the disclosure of the present invention. These and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
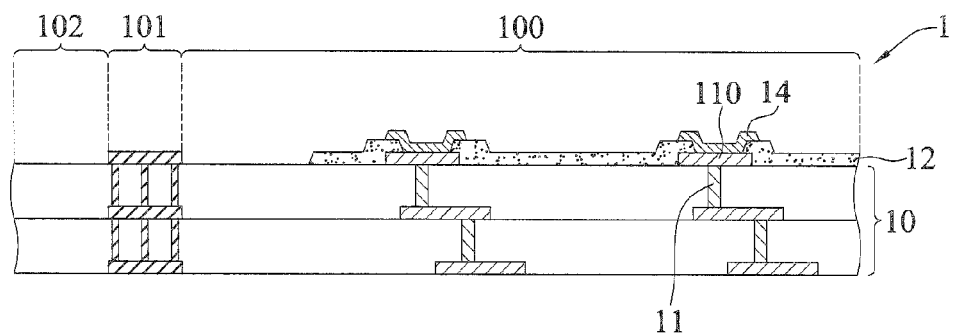
FIG. 1 illustrates a cross-sectional schematic diagram of a traditional semiconductor substrate.
Figure 1:
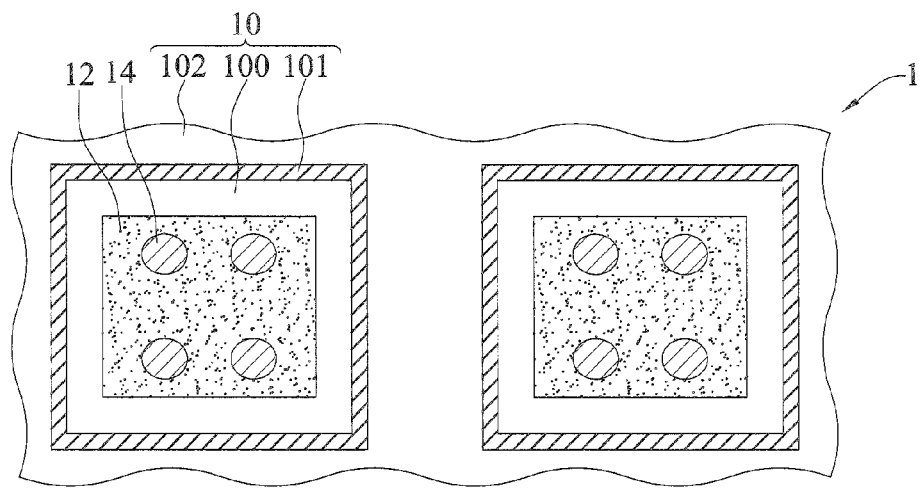
Figure 2:
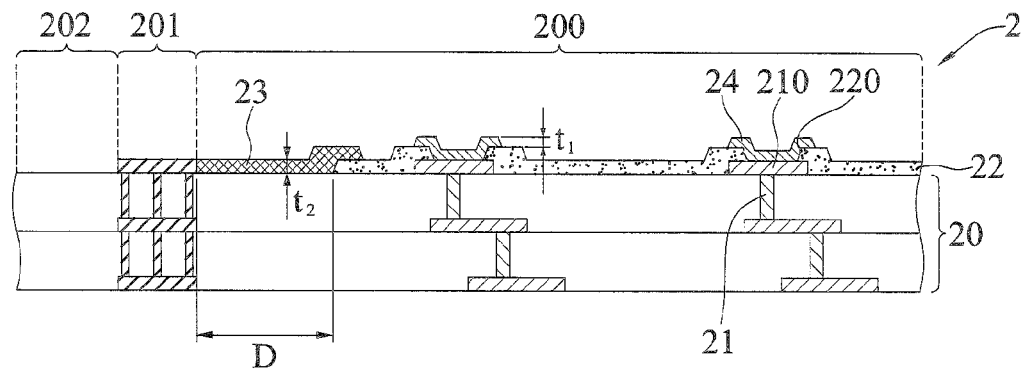
FIG. 2 illustrates a cross-sectional schematic diagram of a substrate structure according to the present invention.
Figure 2:
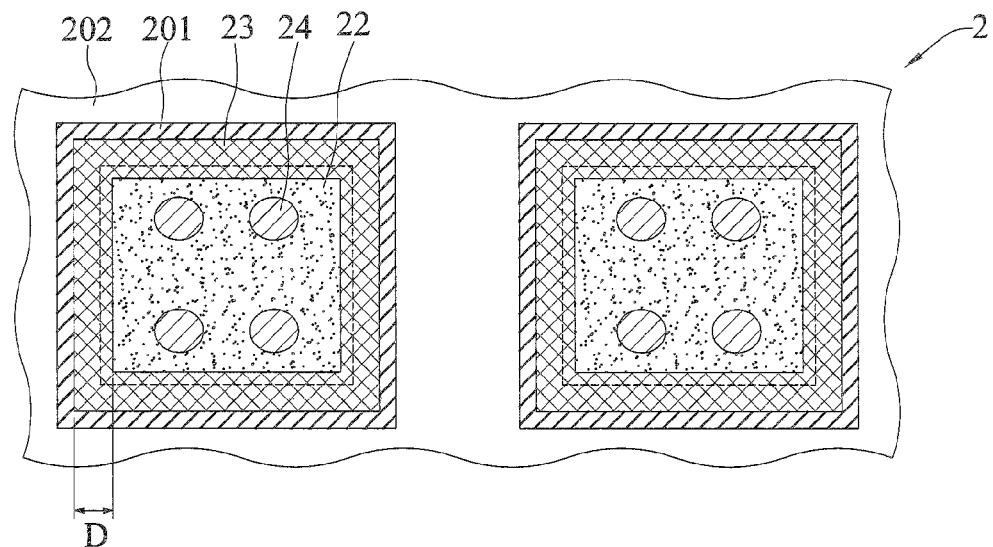

FIG. 2 illustrates a cross-sectional schematic diagram of a substrate structure 2 according to the present invention. FIG. 2' illustrates a top-view schematic diagram of the substrate structure 2 shown in FIG. 2.

As shown in FIGS. 2 and 2', the substrate structure 2 comprises a substrate body 20, a wiring layer 21, an insulating layer 22, and a metal layer 23.

The substrate body 20 is defined with at least one layout area 200, a sealing member 201 adjacent to the layout area 200, and a cutting area 202 adjacent to the sealing member 201.

In an embodiment, the substrate body 20 can be made of various semiconductor substrate materials, such as an interposer with a through-silicon via (TSV), a through silicon interposer (TSI), a semiconductor wafer, etc. In another embodiment, a dielectric layer (not shown) and inner circuits (not shown) can be included inside the substrate body. The inner circuits can be selectively electrically connected to conductive pads. Therefore, the substrate body is not specially limited to a certain structure.

In an embodiment, the sealing member 201 is in a grating shape, and surrounds the layout area 200.

The wiring layer 21 is formed on a portion of a surface of the layout area 200 of the substrate body 20 and within the substrate body 20. In an embodiment, the wiring layer 21 has a plurality of conductive pads 210.

The insulating layer 22 is formed on the wiring layer 21 and a portion of a surface of the layout area 200 of the substrate body 20. In an embodiment, the insulating layer 22 has a plurality of openings 220, and the conductive pads 210 are exposed from the openings 220 of the insulating layer 22.

In an embodiment, the insulating layer 22 is made of $SiN_x$, $SiO_2$, photosensitive dielectric material (PDM), polyimide (PI), bis-benzocyclobutene (BCB), polybenzoxazole (PBO), epoxy, silicone, etc.

In an embodiment, an under bump metallurgy (UBM) 24 is further formed on the conductive pads 210 exposed from the openings 220, and a conductive member (not shown), such as a soldering material or metal bumps, can be formed on the under bump metallurgy 24 in subsequent processes.

In an embodiment, the under bump metallurgy 24 is made of Ti/Cu, Ti/Cu/Ni, Cu/Ni, Cu/Ni/Au, Al/NiV/Cu, etc.

In an embodiment, the insulating layer 22 and the sealing member 201 are kept apart at an interval D, and the insulating layer 22 is not formed on the edge of the layout area 200.

The metal layer 23 is formed on the insulating layer 22 and on a portion of a surface of the layout area 200 of the substrate body 20. In an embodiment, the metal layer 23 is not in contact with the wiring layer 21.

In an embodiment, the under bump metallurgy (UBM) 24 and the metal layer 23 can be formed simultaneously or non-simultaneously. For example, the under bump metallurgy (UBM) 24 is formed before or after the metal layer 23 is formed. It is preferable to make the under bump metallurgy (UBM) 24 be formed simultaneously with the formation of the metal layer 23, in order not to increase the fabrication process and the cost.

In an embodiment, the materials or thicknesses t1/t2 of the under bump metallurgy 24 and the metal layer 23 can be the same or different. For example, the under bump metallurgy 24 is made of Al/NiV/Cu, while the metal layer 23 is made of Cu.

In an embodiment, the metal layer 23 has one side that covers a portion of the insulating layer 22, and the other side that is in contact with the sealing member 201, such that a bonding force between the insulating layer 22 and the substrate body 20 is increased. Therefore, the metal layer 23 can prevent the cracks on a surface of the substrate body 20 from extending to the layout area 200 when a singulation process is carried out along the cutting area 202.

In an embodiment, the metal layer 23 surrounds the insulating layer 22 to form a metal frame and cover the whole interval D.

Figure 3:
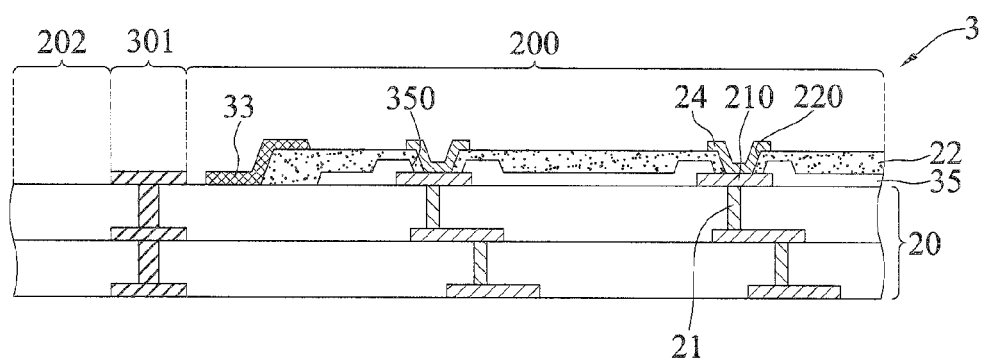
FIG. 3 illustrates a cross-sectional schematic diagram of a substrate structure of another embodiment according to the present invention.

FIG. 3 illustrates a cross-sectional schematic diagram of a substrate structure 3 of another embodiment according to the present invention. The substrate structure 3 differs from the substrate structure 2 in that the substrate structure 3 further comprises a dielectric layer and the sealing member is formed in a different aspect.

As shown in FIG. 3, the metal layer 33 is not in contact with the sealing member 301, but still surrounds the insulating layer 22 to form a metal layer. In an embodiment, the sealing member 301 is in a ring shape. In an embodiment, the substrate structure 3 further comprises a dielectric layer 35 formed between the insulating layer 22 and the substrate body 20.

In an embodiment, the dielectric layer 35 has a plurality of openings 350, and the conductive pads 210 are exposed from the openings 350. The dielectric layer 35 is first formed on a portion of the layout area 200 and on the wiring layer 21, and then the insulating layer 22 is formed on the dielectric layer 35 and on a portion of the layout area 200. Subsequently, the conductive pads 210 are exposed from the openings 220 of the insulating layer 22.

In an embodiment, the dielectric layer 35 is made of $SiN_x$, $SiO_2$, photosensitive dielectric material (PDM), polyimide (PI), bis-benzocyclobutene (BCB), polybenzoxazole (PBO), epoxy, silicone, etc.

In an embodiment, the insulating layer 22 and the dielectric layer 35 are made of the same or different materials.

In summary, the substrate structure 2, 3 according to the present invention has a metal layer 23 formed on the surface of the substrate body 20 and the insulating layer 22, such that a bonding force between the substrate body 20 and the insulating layer 22 is increased, and the insulating layer 22 can be prevented from being delaminated.

During a singulation process, the metal layer 23 can prevent the cracks of the cutting area 202 of the substrate body 20 from extending to the layout area 200. Therefore, the metal layer 23 can prevent the wiring layer 21 from being damaged, and the yield rate of the product is increased.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A substrate structure, comprising:
    a substrate body having a sealing member and being defined with at least one layout area and a cutting area, wherein the sealing member is adjacent to the layout area, and the cutting area is adjacent to the sealing member such that the sealing member is positioned between the layout area and the cutting area;
    a wiring layer formed on a first portion of a surface of the layout area of the substrate body;
    an insulating layer formed partially on the wiring layer and on a second portion of the surface of the layout area of the substrate body; and
    a metal layer formed on the insulating layer and on a third portion of the surface of the layout area of the substrate body.

2. The substrate structure according to claim 1, wherein the sealing member surrounds the layout area.

3. The substrate structure according to claim 1, wherein the sealing member is in a grating shape.

4. The substrate structure according to claim 1, wherein the sealing member is in a ring shape.

5. The substrate structure according to claim 1, wherein the wiring layer has a plurality of conductive pads, and the plurality of the conductive pads are exposed from the insulating layer.

6. The substrate structure according to claim 5, further comprising an under bump metallurgy formed on each of the conductive pads.

7. The substrate structure according to claim 6, wherein the under bump metallurgy and the metal layer are made of a same material.

8. The substrate structure according to claim 6, wherein the under bump metallurgy and the metal layer are made of different materials.

9. The substrate structure according to claim 6, wherein the under bump metallurgy and the metal layer are of a same thickness.

10. The substrate structure according to claim 6, wherein the under bump metallurgy and the metal layer are of different thicknesses.

11. The substrate structure according to claim 1, wherein the metal layer is free from being in contact with the wiring layer.

12. The substrate structure according to claim 1, wherein the metal layer is partially in contact with the sealing member.

13. The substrate structure according to claim 1, wherein the metal layer is free from being in contact with the sealing member.

14. The substrate structure according to claim 1, further comprising a dielectric layer formed between the insulating layer and the substrate body.

15. The substrate structure according to claim 14, wherein the insulating layer and the dielectric layer are made of a same material.

16. The substrate structure according to claim 14, wherein the insulating layer and the dielectric layer are made of different materials.

* * * * *